(12) United States Patent
Chertkow et al.

(10) Patent No.: US 9,564,208 B2
(45) Date of Patent: Feb. 7, 2017

(54) LOW POWER RADIATION HARDENED MEMORY CELL

(71) Applicant: Dolphin Integration, Meylan (FR)

(72) Inventors: Oron Chertkow, Ashdod (IL); Ariel Pescovsky, Kfar-Saba (IL)

(73) Assignee: Dolphin Integration, Meylan (FR)

( * ) Notice: Subject to any disclaimer, the term of this patent is extended or adjusted under 35 U.S.C. 154(b) by 0 days.

(21) Appl. No.: 14/871,508

(22) Filed: Sep. 30, 2015

(65) Prior Publication Data

US 2016/0099027 A1    Apr. 7, 2016

Related U.S. Application Data

(60) Provisional application No. 62/058,126, filed on Oct. 1, 2014.

(51) Int. Cl.
| | | |
|---|---|---|
| *G11C 14/00* | (2006.01) | |
| *G11C 11/412* | (2006.01) | |
| *G11C 16/04* | (2006.01) | |
| *G11C 16/10* | (2006.01) | |
| *G11C 5/00* | (2006.01) | |
| *G11C 29/00* | (2006.01) | |

(52) U.S. Cl.
CPC ........... *G11C 11/4125* (2013.01); *G11C 5/005* (2013.01); *G11C 14/00* (2013.01); *G11C 16/0441* (2013.01); *G11C 16/10* (2013.01); *G11C 29/789* (2013.01)

(58) Field of Classification Search
CPC ..... G11C 14/00; G11C 16/0441; G11C 16/10; G11C 29/789
USPC .......................................... 365/185.08, 185.07
See application file for complete search history.

(56) References Cited

U.S. PATENT DOCUMENTS

| | | | |
|---|---|---|---|
| 6,173,379 B1* | 1/2001 | Poplingher | G11C 11/417 365/227 |
| 7,791,941 B2* | 9/2010 | Hanafi | G11C 11/412 365/158 |
| 8,971,113 B2* | 3/2015 | Lee | G11C 14/0063 365/185.08 |
| 2015/0061730 A1* | 3/2015 | Tsai | H03K 3/356034 327/57 |

* cited by examiner

*Primary Examiner* — Pho M Luu
(74) *Attorney, Agent, or Firm* — Wolf, Greenfield & Sacks, P.C.

(57) ABSTRACT

The invention concerns a memory cell having: first and second cross-coupled gated inverters (102, 104), each including first and second inputs (IN1, IN2) and an output (OUT) and being adapted to couple its output to a first logic level only when the first and second inputs both receive the inverse of the first logic level; a first cut-off circuit (106) coupling the second input (IN2) of the first gated inverter (102) to the first input (IN1) of the first gated inverter (102); and a second cut-off circuit (108) coupling the second input (IN2) of the second gated inverter (104) to the first input (IN1) of the second gated inverter (104).

14 Claims, 7 Drawing Sheets

LOW POWER RADIATION HARDENED MEMORY CELL

CROSS REFERENCE TO RELATED APPLICATIONS

This Application claims priority under 35 U.S.C. §119(e) to U.S. Provisional Application Ser. No. 62/058,126, entitled "LOW POWER RADIATION HARDENED MEMORY CELL" filed on Oct. 1, 2014, which is herein incorporated by reference in its entirety.

FIELD

The present disclosure relates to memory cells, and more particularly to radiation hardened memory cells having protection against SEUs (single event upsets).

BACKGROUND

Electronic systems often require the ability to store data to a memory (writing) and retrieve data from the memory (reading). A memory array is composed of memory cells. Each memory cell is capable of storing a bit of data. Such memory cells are typically composed of transistors such as MOSFET.

Scaling of transistor dimensions and of electronic devices in the microelectronics industry has brought about two unintended significant problems related to memory cells: the first is a rapid increase in susceptibility to radiation-induced errors; the second is a rise of overall power consumption, mainly due to the increase of leakage currents.

Radiation induced errors in electronic circuits are caused by an energy transfer when a radiation particle strikes the substrate of the electronic circuit, resulting in the excitement of electron-hole pairs. If the impact occurs at a transistor's reversed biased drain junction, these electrical charge carriers will drift into the junction, resulting in a transient current pulse. Due to the finite resistance of the transistors composing the memory cell, this current pulse may result in a voltage level change of the struck junction, logically interpreted as a change of the data stored in the cell.

Low voltage operation as a manner of power consumption reduction only aggravates radiation susceptibility related reliability issues, since the electrical charge accumulating in the struck junction depends on the junction's capacitance and voltage.

Either low power adequate memory cells or radiation-hardened memory cells have been designed before, but there is a need for a memory cell which efficiently combines low power and SEU tolerance characteristics.

SUMMARY

It is an aim of embodiments of the present description to at least partially address one or more problems in the prior art.

Embodiments of the present disclosure relate to a memory cell design providing solutions to one or more limitations in the prior art. According to one aspect, data storage node redundancy is provided. According to another aspect, the redundant data storage nodes are capable of being electrically separated from each other. These aspects allow corrupted information in a struck node to be restored by providing a parallel redundant unstruck node. According to a further aspect, in some embodiments, power consumption reduction is provided by implementing high resistance supply rail connections, which for example lower leakage currents.

The memory cells described herein for example comprise a pair of cross-coupled gated inverters. A "gated inverter" is an inverter with an additional input gate. If both inputs are at the same logic state, the output will be equivalent to that of a regular inverter. If the inputs differ from each other, the output is floating with the logic state of the last output. According to some embodiments, a 'cut-off' network is utilized to separate the two gates of each gated inverter, in order to create two separated data storage nodes—a main node and a secondary one. In a non-radiation environment, the main and secondary nodes for example have equal logic states. Thus there are two sets of separated dual data storage nodes. One set serves the primary set of data storage nodes and the other serves as its subsidiary inverted counterpart, used for data restoration of the struck node and for static characteristics while storing information. In some embodiments, an 'access network' can be coupled to each of the main data storage nodes, for example for read and write purposes.

According to one aspect, there is provided a memory cell comprising: first and second gated inverters, each gated inverter comprising first and second inputs and an output and being adapted to couple its output to a first logic level only when the first and second inputs both receive the inverse of the first logic level, wherein the first input of the first gated inverter is coupled to the output of the second gated inverter and the first input of the second gated inverter is coupled to the output of the first gated inverter; a first cut-off circuit coupling the second input of the first gated inverter to the first input of the first gated inverter; and a second cut-off circuit coupling the second input of the second gated inverter to the first input of the second gated inverter.

According to one embodiment, the first and second cut-off circuits each comprise at least one transistor of a first conductivity type and at least one further transistor of an opposite conductivity type to the first conductivity type.

According to one embodiment, the first cut-off circuit comprises first and second transistors coupled in series between the first and second inputs of the first gated inverter; and the second cut-off circuit comprises first and second transistors coupled in series between the first and second inputs of the second gated inverter.

According to one embodiment, the first transistors of the first and second cut-off circuits are p-channel MOS transistors, and second transistors of the first and second cut-off circuits are n-channel MOS transistors.

According to one embodiment, each of the first and second gated inverters comprises: first and second transistors coupled in series between the output and a first voltage supply rail; third and fourth transistors coupled in series between the output and a second voltage supply rail, wherein control nodes of the first and fourth transistors form the first input of the gated inverter and control nodes of the second and third transistors form the second input of the gated inverter.

According to one embodiment, the first transistor of each gated inverter is connected to the first voltage supply rail and is of narrower width than the second transistor of each gated inverter; and/or the fourth transistor of each gated inverter is connected to the second voltage supply rail and is of narrower width than the third transistor of each gated inverter.

According to one embodiment, the first and second transistors of the first and second gated inverters are p-channel MOS transistors; the first and second transistors of the first and second cut-off circuits are p-channel MOS transistors formed in a first n-type well separate from one or more n-type wells in which the first and second transistors of the first and second gated inverter are formed.

According to one embodiment, the first and second transistors of the first gated inverter are formed in a second n-type well, and the first and second transistors of the second gated inverter are formed in a third n-type well.

According to one aspect, there is provided a memory device comprising: at least one of the above memory cells; and a control circuit adapted to control the first and second cut-off circuits of the at least one memory cell to be non-conducting during a hold state of the memory cell, and to control the first and second cut-off circuits of the at least one memory cell to be conducting during a write operation of the memory cell.

According to one embodiment, the control circuit is further adapted to control the first and second cut-off circuits of the at least one memory cell to be non-conducting during a read operation of the memory cell.

According to one embodiment, the memory device is a memory array comprising at least four of the above memory cells arranged in columns and rows, wherein the memory cells of each column are coupled between a common pair of bits lines of the column.

According to one embodiment, the first storage node of each memory cell is coupled to a first bit line of the common pair via a first access network, and the second storage node of each memory cell is coupled to a second bit line of the common pair via a second access network, and the control circuit is further adapted to control the first and second access networks to be conductive during a write operation of each memory cell, and to be non-conductive during a hold state of each memory cell.

According to one embodiment, the memory device is a synchronous memory device comprising: a master latch comprising the above memory cell; and a slave latch coupled to an output of the master latch and comprising the above memory cell.

According to a further aspect, there is provided a method of controlling a memory cell comprising first and second gated inverters, each gated inverter comprising first and second inputs and an output and being adapted to couple its output to a first logic level only when the first and second inputs both receive the inverse of the first logic level, wherein the first input of the first gated inverter is coupled to the output of the second gated inverter and the first input of the second gated inverter is coupled to the output of the first gated inverter, the method comprising: selectively coupling, by a first cut-off circuit, the second input of the first gated inverter to the first input of the first gated inverter; and selectively coupling, by a second cut-off circuit, the second input of the second gated inverter to the first input of the second gated inverter.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to designate a direct connection between circuit elements or nodes, whereas the term "coupled" is use to designate a connection between circuit elements or nodes which may be direct, or may be via one or more intermediate circuit elements such as resistors, capacitors or transistors.

Figure 1:
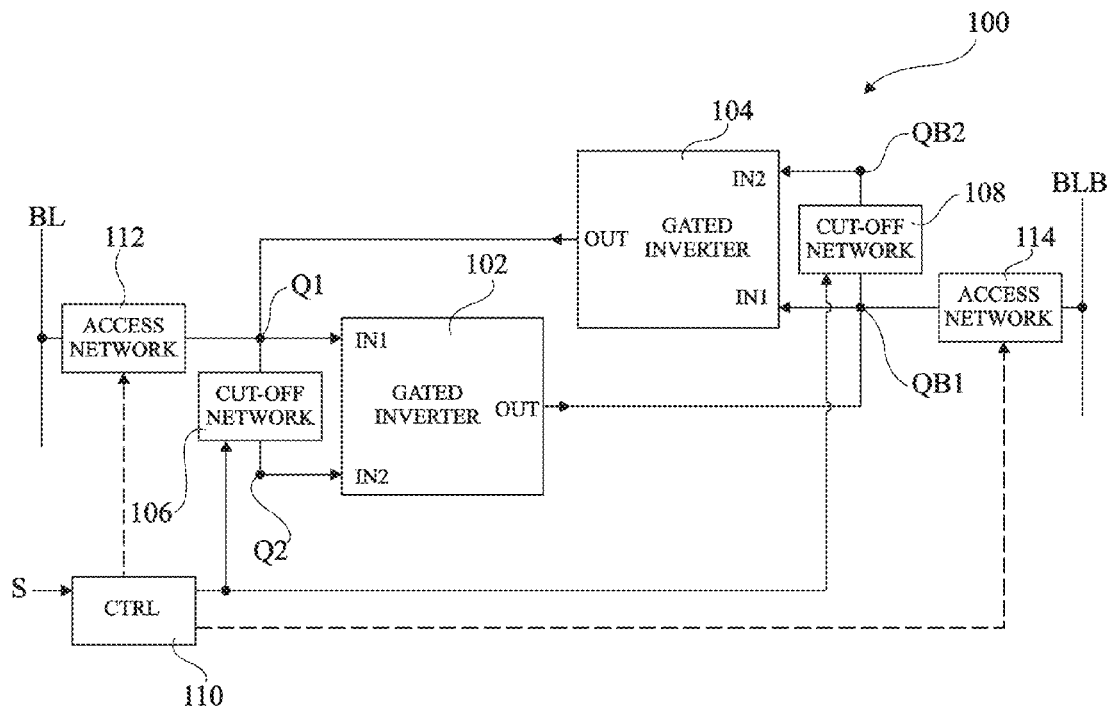
FIG. 1 is a block diagram of a memory cell according to an example embodiment of the present disclosure.

FIG. 1 is a block diagram of a memory cell 100 capable of storing one of two logic states. The logic states can be defined as, but are not limited to, the following exemplified definitions. A high voltage level at the main data storage node of the primary set, and a low voltage level at the main data storage node of the subsidiary inverted set, can for example be considered to correspond to a logic '1' stored at the memory cell for the sake of this explanation. A low voltage level at the main data storage node of the primary set, and a high voltage level at the main data storage node of the subsidiary inverted set, can for example be considered as logic '0' stored at the memory cell for the sake of this explanation.

The memory cell 100 is for example protected from SEU and in some embodiments is capable of low power characteristics.

The memory cell 100 for example comprises a pair of gated inverters 102, 104 cross-coupled between main storage nodes Q1, QB1 of the memory cell. Each gated inverter is for example a configuration of transistors, such as MOS transistors, having two inputs, and an output. Each gated inverter is for example adapted to couple its output to a given logic level only when both of its first and second inputs receive the inverse of that logic level. For example, when both inputs are at a logic "1" state, the output of the gated inverter is for example a logic "0" state, and when both inputs are at a logic "0" state, the output of the gated inverter is for example a logic "1" state. However, when the inputs of a gated inverter are at different states, the output is for example coupled to neither a logic "1" nor a logic "0" state, and is for example floating at the previous voltage level stored at the output node, which could be a logic "1" or a logic "0" regardless of the state of the inputs.

The gated inverters 102, 104 are for example cross-coupled via an input IN1 of each gated inverter. Each gated inverter 102, 104 for example has its other input IN2 coupled to its input IN1 via a cut-off network 106, 108 respectively. For example, the input IN2 of the gated inverter 102 is coupled to the input IN1 of the gated inverter 102 via a cut-off network 106, creating a secondary storage node Q2 at the input IN2. Similarly, the input IN2 of the gated inverter 104 is coupled to the input IN1 of the gated inverter 104 via a cut-off network 108, creating a secondary storage node QB2 at the input IN2. Each cut-off network 106, 108 corresponds to one or more switches controlled by a control circuit (CTRL) 110 to either connect together the inputs IN1, IN2 of each gated inverter 102, 104, or to electrically isolate the inputs IN1, IN2 of each gated inverter 102, 104. The control circuit 110 for example receives an input signal S indicating a state of the memory cell. For example, the signal S indicates when the memory cell is to be in a hold state, and when a read or write operation is to be performed.

In some embodiments, the memory cell 100 is part of a memory array in which a plurality of similar cells (not illustrated in FIG. 1) are all coupled to a pair of common bit lines BL, BLB. For example, the storage node Q1 is coupled to the bit line BL via an access network 112, and the storage node QB1 is coupled to the bit line BLB via an access network 114. Each access network 112, 114 corresponds to one or more switches for example controlled by the control circuit (CTRL) 110 to either couple the storage nodes Q1 and QB1 to the bit lines BL and BLB respectively, or to electrically isolate the memory cell from the bit lines BL, BLB. For example, the control circuit 110 generates a word line signal WL for controlling the access networks of a row of memory cells of the memory array.

In some embodiments, described in more detail below, each of the gated inverters 102, 104 has supply rail connections of relatively high resistance.

Figure 2:
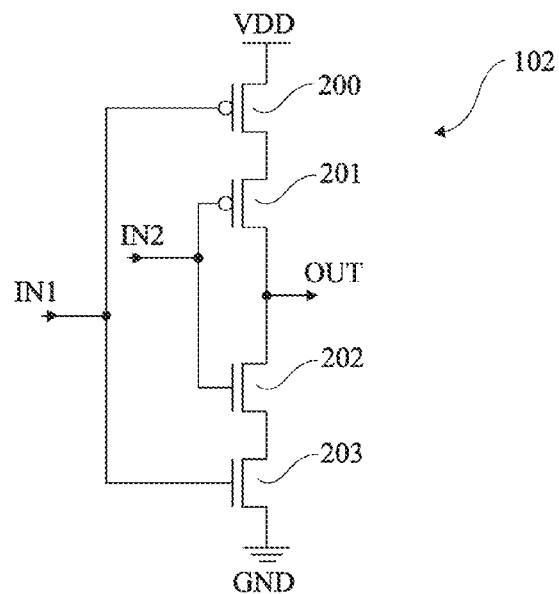
FIG. 2 schematically illustrates a "gated inverter" block of FIG. 1 in more detail according to an example embodiment.

FIG. 2 schematically illustrates the gated inverter 102 according to an example embodiment. The gated inverter 104 is for example implemented by a similar circuit. The gated inverter 102 for example comprises a pair of transistors 200, 201, which are for example PMOS transistors, coupled in series between a supply voltage rail VDD and the output OUT of the inverter, and a pair of transistors 202, 203, which are for example NMOS transistors, coupled in series between the output OUT of the inverter and a ground voltage rail GND. The transistors 200 and 203 are for example the outer transistors of the inverter connected to the supply rails and their control nodes are coupled together to form the input IN1 of the inverter. The transistors 201, 202 are for example the inner transistors of the inverter connected to the output OUT and their control nodes are coupled together to form the input IN2 of the inverter. However, a different order of the transistors would be possible.

The connections from the transistors 200 and 203 to the respective supply rails VDD, GND are for example of relatively high resistance, thereby decreasing leakage currents from the supply rails, and resulting in static power consumption reduction during a hold state of the memory cell, during which no reading or writing operation is performed.

Figure 3:
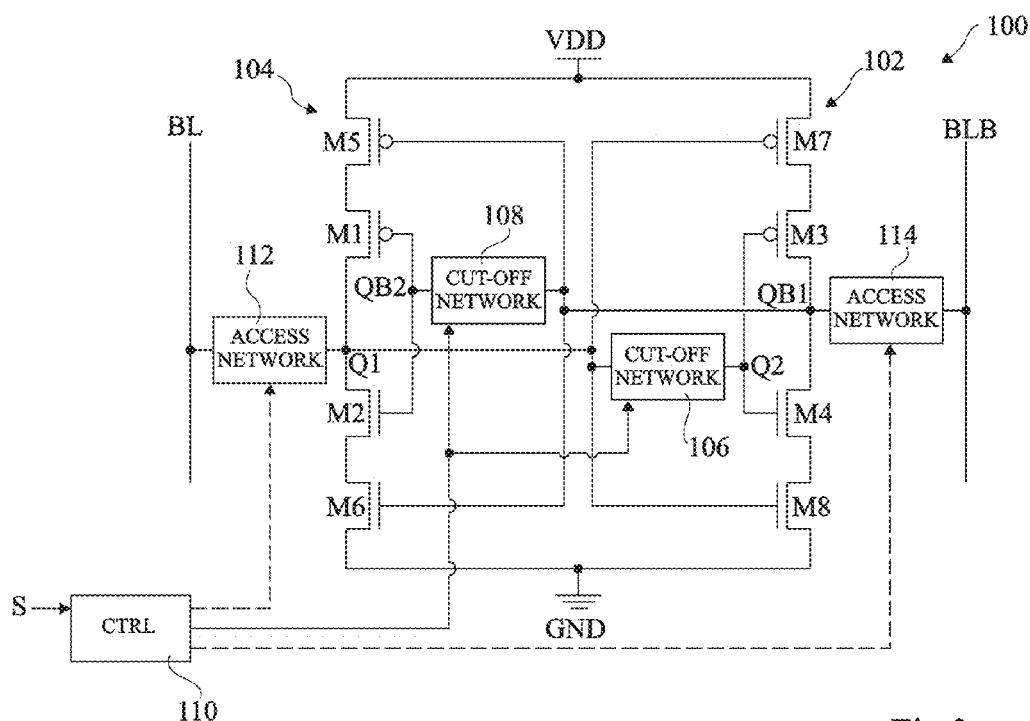
FIG. 3 schematically illustrates the memory cell of FIG. 1 comprising the gated inverter of FIG. 2 according to an example embodiment of the present disclosure.

FIG. 3 schematically illustrates the memory cell 100 incorporating the gated inverter circuit of FIG. 2 implementing each gated inverter 102, 104. The transistors 200, 201, 202 and 203 of the gated inverter 102 are respectively labelled M7, M3, M4 and M8 in FIG. 3, while the transistors 200, 201, 202 and 203 of the gated inverter 104 are respectively labelled M5, M1, M2 and M6 in FIG. 3.

In some embodiments, the transistors M1, M2, M3 and M4 of the gated inverters 102, 104 are low threshold voltage (LVT) transistors having a lower threshold than the transistors M5, M6, M7 and M8. Such a feature makes the gated inverters 102, 104 more sensitive to the voltage levels of the secondary data storage nodes Q2 and QB2.

The access networks 112, 114 may be implemented by any configuration of transistors, for example MOS transistors, that can drive data to and from the bit lines BL, BLB. For example, the access networks 112, 114 are capable of driving data from the data path provided by the bit line BL and the complementary bit line BLB into the main data storage nodes Q1, QB1, and of extracting data stored at the main data storage nodes Q1, QB1 to the data path provided by the bit-line BL and/or the complementary bit line BLB. In some embodiments, the access networks are each implemented by a single transistor, as will now be described with reference to FIG. 4.

Figure 4:
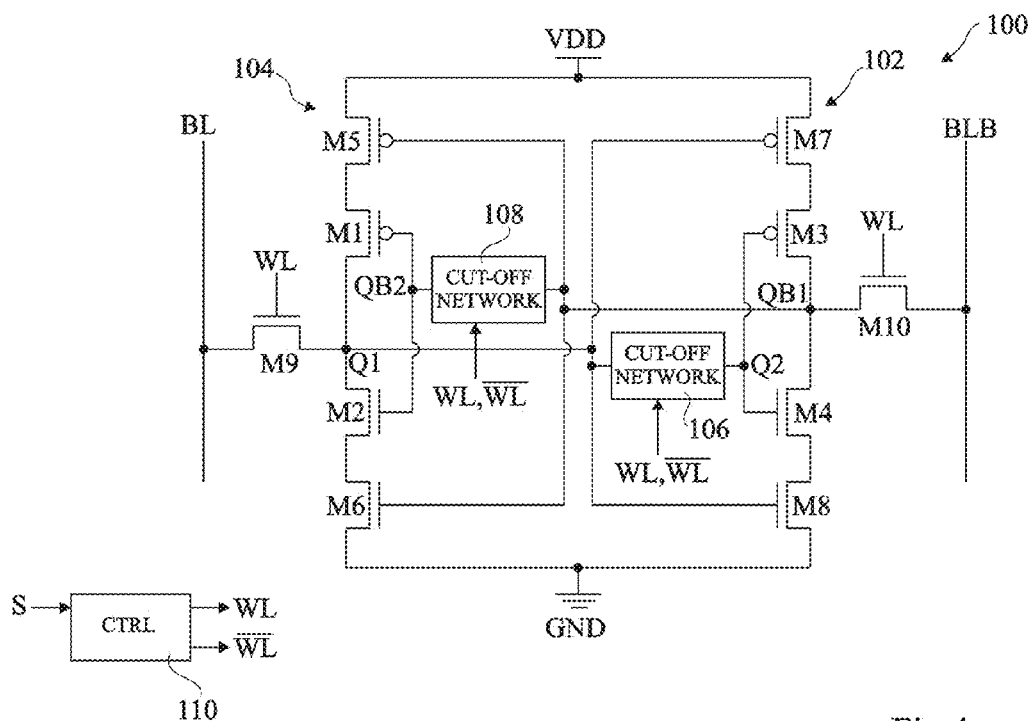
FIG. 4 schematically illustrates the memory cell of FIG. 3 in more detail for a case in which access networks of the memory cell each comprise a single transistor in accordance with an embodiment of the present disclosure.

FIG. 4 schematically illustrates the memory cell 100, which is the same as the circuit of FIG. 3, except that the access network 112 is implemented by a transistor M9, which is for example an NMOS transistor, coupled between the storage node Q1 and the bit line BL, and the access network 114 is implemented by a transistor M10, which is for example an NMOS transistor, coupled between the storage node QB1 and the bit line BLB. The transistors M9 and M10 are for example controlled at their gates by a control signal WL, which is for example a word line signal. Of course, it will be apparent to those skilled in the art that access networks comprising other combinations of transistors such as, but not limited to, one or more PMOS and NMOS transistors could be used.

The cut-off networks 106, 108 in FIG. 4 are for example controlled by the signal WI and its inverse $\overline{WL}$, as will now be described with reference to FIG. 5.

Figure 5:
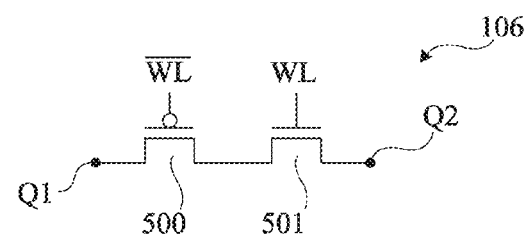
FIG. 5 schematically illustrates a cut-off network of the memory cell of FIG. 1 in more detail according to an example embodiment of the present disclosure.

FIG. 5 schematically illustrates the cut-off network 106 according to an example embodiment. For example, the cut-off network 106 comprises a pair of transistors 500, 501 coupled in series with each other between the storage nodes Q1 and Q2. The cut-off network 108 for example comprises similar transistors coupled between the storage nodes QB1 and QB2. The transistor 500 is for example a PMOS transistor controlled at its gate by the inverse $\overline{WL}$ of the control signal WL, and the transistor 501 is for example an NMOS transistor controlled at its gate by the control signal WL. However, in alternative embodiments, the transistors 500 and 501 could be controlled by other signals that are not necessarily related to each other.

More generally, the cut-off networks 106, 108 could each be implemented by any two-ended switching circuit capable of being rendered conductive or non-conductive between its ends by a control signal. For example, while in the embodiment of FIG. 5 the cut-off networks 106, 108 are implemented by a pair of transistors, in alternative embodiments they could each be implemented by a single transistor.

An advantage of using an implementation similar to that of FIG. 5 in which the cut-off networks comprise transistors of opposite conductivity types is that this choice further enhances the electrical separation of the storage nodes when radiation particles are present. An NMOS transistor is conductive when Vg−Vs>Vth, where Vg is the gate voltage, Vs is the source node voltage, and Vth is the threshold voltage of the transistor. A radiation particle impact can induce a negative voltage Vn at the source node of a NMOS transistor. This negative voltage Vn can be of high enough magnitude to cause the NMOS transistor to become conductive, even if the gate is biased at a ground voltage, since Vg−Vs=0−Vn>Vth, when Vn is negative and the magnitude of Vn is greater than Vth. The same considerations applies to the PMOS transistor. A PMOS transistor is conductive if Vs−Vg>Vth, where Vg is the gate voltage, Vs is the source node voltage and Vth is the threshold voltage. A radiation particle impact can induce a voltage level Vp higher than the supply voltage VDD at the source node of a PMOS transistor. This voltage level Vp may be sufficiently higher than the supply voltage VDD to cause the PMOS transistor to become conductive, even if the gate is biased at the supply voltage VDD, since Vs−Vg=Vp−VDD>Vth, when Vp is higher than VDD+Vth. Thus, if the cut-off networks 106, 108 are formed by a single transistor type, the above phenomenon would lead to it failing due to a logic "1" to logic "0" radiation induced transition when using a single NMOS for the cut-off network, and at logic "0" to logic "1" radiation induced transition when using a single PMOS. The chained structure of transistors of FIG. 5 enhances separation provided by the cut-off networks 106, 108 because if one of the transistors fails, the other will remain non-conducting and an SEU transient will not permeate to the other end of the cut-off network.

Either the NMOS end or the PMOS end of the cut-off networks 106, 108 can be connected to the input IN2 of the gated inverter 102, 104 respectively. However, in some embodiments the PMOS end of each cut-off network 106, 108 is connected to the inner input gate, in other words the input IN2, of the gated inverters, such that the floating end of the "cut-off network" is placed at the inner gate of the gated inverters. The reason for this choice is that a PMOS is less susceptible to radiation impact induced current transients as it is formed within an n-type well (N-WELL). The N-WELL acts as a potential barrier preventing charge deposited beyond the N-WELL boundaries from diffusing back to the struck drain junction, resulting in lesser charge collection.

Figure 6:
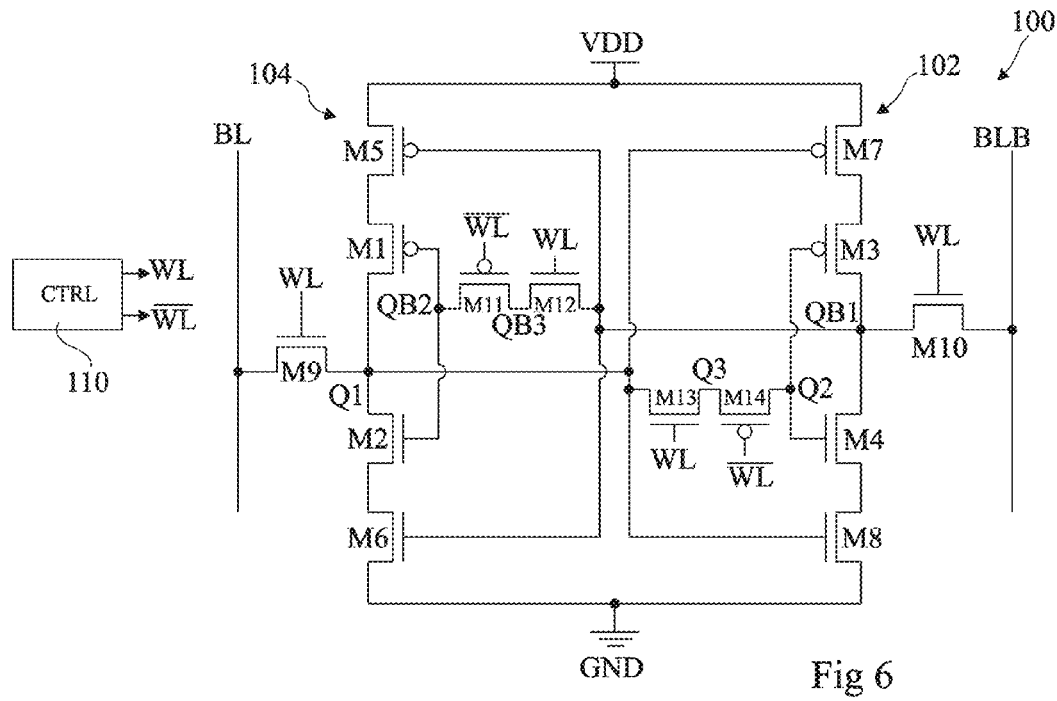
FIG. 6 schematically illustrates a memory cell according to a further example embodiment of the present disclosure.

FIG. 6 schematically illustrates the memory cell 100, which is the same as the circuit of FIG. 4, except that the cut-off network 108 is implemented by the circuit of FIG. 5, in which the transistors 500 and 501 are respectively labelled M11 and M12, and the cut-off network 106 is also implemented by the circuit of FIG. 5, in which the transistors 500 and 501 are respectively labelled M14 and M13.

In some embodiments, the transistors M11, M12, M13 and M14 are LVT transistors having a lower threshold voltage than one or more other transistors in the design, and for example lower than the threshold voltages of transistors M5, M6, M7 and M8. This for example increases the voltage margin at the Q2/QB2 nodes, by propagating a larger voltage swing during the write operation, thereby assuring that at the side holding a logic '1', the gated inverter's inner PMOS transistor M1 or M3 will be conducting (open), and its complimentary gated inverter's inner NMOS transistor M2 or M4 will be in a non-conducting cut-off state (closed).

As represented in FIG. 6, the sources of transistors M5 and M7 are for example connected to the voltage supply rail VDD, while the sources of transistors M6 and M8 are connected to the ground rail. The main data storage node 'Q1' is at the shared drain between transistors M1, M2, M9 and M13, and its inverted counterpart 'QB1' is at the shared drain between transistors M10, M3, M4 and M12. The secondary data node 'Q2' is at the shared junction between the gates of transistors M3 and M4 and the drain of transistor M14, and its inverted counterpart 'QB2' is at the shared junction between the gates of transistors M1 and M2 and the drain of transistor M11. A node between transistors M13 and M14 is labelled Q3, and a node between transistors M11 and M12 is labelled QB3.

The control circuit 110 for example generates the control signals WL and $\overline{\text{WL}}$ for controlling the transistors M9, M10, M11, M12, M13 and M14.

Operation of the circuit of FIG. 6 will now be described in more detail with reference to FIGS. 7A, 7B, 8 and 9.

Figure 7A:
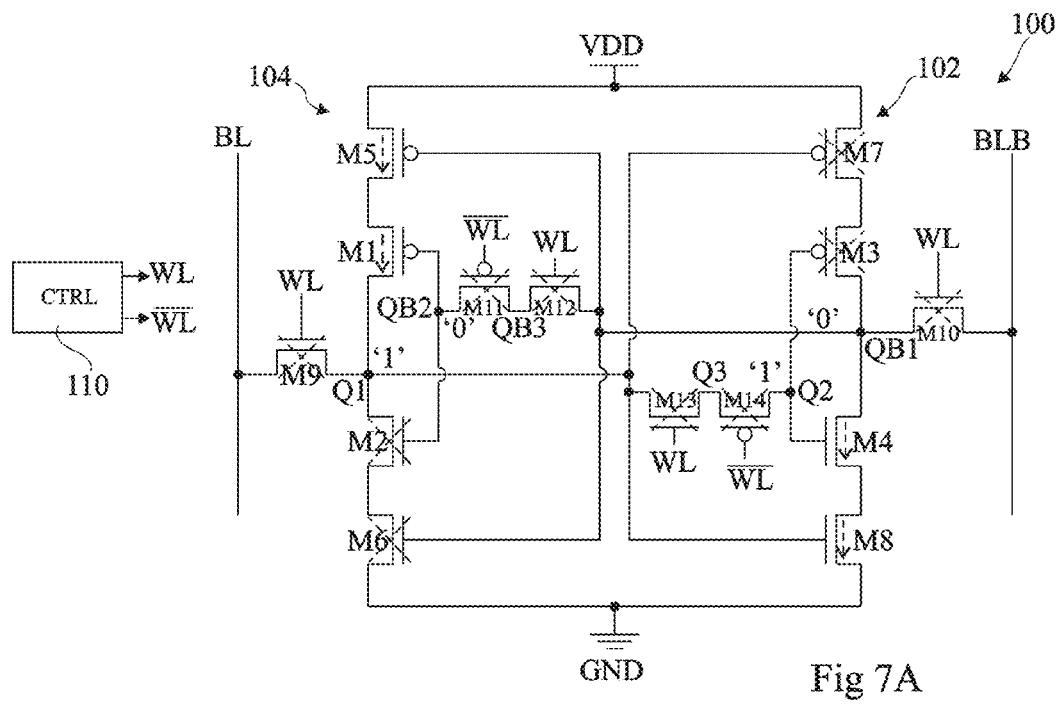
FIG. 7A schematically illustrates the memory cell of FIG. 6 during a hold state while storing a logic '1' according to an example embodiment of the present disclosure.

FIG. 7A illustrates the memory cell during a hold state. The hold state is defined as the state in which no read or write operation to or from the memory cell is attempted, and the voltage levels in the cell are maintained at stable levels. During the hold state, the control signal WL is for example low, and the control signal $\overline{\text{WL}}$ is for example high, thereby isolating the data stored at the secondary storage nodes Q2 and QB2 from the data stored at the primary storage nodes Q1 and QB1. In normal operational mode (i.e. no radiation impact), the storage nodes Q1 and Q2 hold the same logic state ('0' or '1') while the storage nodes QB1 and QB2 also hold the same logic state, which is opposite to the state held at the nodes Q1 and Q2. To aid understanding, it is for example assumed that the memory cell holds a logic '1', that is: Q1 is at a logic '1' state, rendering transistor M8 conductive and transistor M7 non-conductive; Q2 is at a logic '1' state, rendering transistor M4 conductive and transistor M3 non-conductive; QB1 is at a logic '0' state, rendering transistor M5 conductive and transistor M6 non-conductive; and QB2 is at a logic '0' state, rendering transistor M1 conductive and transistor M2 non-conductive. These conductions states of the various transistors are represented in FIG. 7A by dashed arrows (transistor conductive) and dashed crosses (transistor non-conductive). During the hold state, low resistant paths are thus established from the supply rails to the data storing nodes Q1 and QB1, allowing the voltages at these nodes to be replenished in order to hold and maintain the data stored in the cell. Furthermore, the levels at the nodes Q2 and QB2 are for example slowly replenished by leakage current through the cut-off networks 106, 108 to match the logic state of the data storage nodes Q1 and QB1 at the other end of the cut-off networks 106, 108, accordingly.

The memory cell 100 in the state shown in FIG. 7A is for example protected from SEU as a result of radiation particles hitting any of its transistors, as will now be described. An analysis of three different potentially hazardous cases where the memory cell is struck are presented hereafter. Due to the memory cell's symmetry, particle impacts at Q1 and Q2 alone will be discussed. Impacts at QB1 and QB2 are identical but operate on the opposite nodes.

In the event of a particle hitting the reversed biased NMOS drain of transistor M2 while the nodes Q1 holds a logic '1' state, a current transient for example changes the state at Q1 from the logic '1' to the logic '0' state. The cut-off network 106 formed by transistors M13 and M14 prevents this transient from propagating over to the storage node Q2. Therefore, transistor M7 is rendered conductive and transistor M8 is rendered non-conductive, but transistor M3 remains non-conducting and transistor M4 remains conducting due to the logic '1' stored at the storage node Q2. Thus neither the storage node QB1, nor the storage node QB2, changes its logic state, and so transistors M1 and M5 remain conductive, enabling the struck node Q1 to replenish its original state.

Figure 7B:
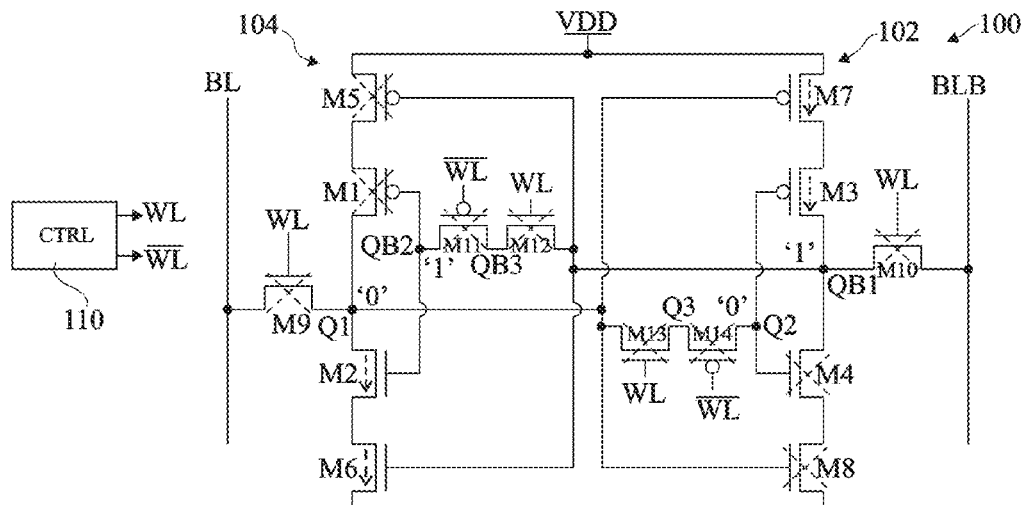
FIG. 7B schematically illustrates the memory cell of FIG. 6 during a hold state while storing a logic '0' according to an example embodiment of the present disclosure.

As a further example, the opposite state of the memory cell to that shown in FIG. 7A can be considered as shown in FIG. 7B.

FIG. 7B illustrates the memory cell of FIG. 7A but in a state in which it stores a logic '0'. Thus the storage nodes Q1 and Q2 are at a logic '0', with transistors M1, M4, M5 and M8 non-conductive, and transistors M2, M3, M6 and M7 conductive. Transistors M11 to M14 of the cut-off networks are non-conductive. Now, when an energized particle hits the reversed biased PMOS drain of transistor M1 at the '0' holding Q1 node, a current transient changes the logic state at node Q1 from the logic '0' to the logic '1' state. The cut-off network 106 prevents the transient from propagating over to the storage node Q2. Therefore, transistor M7 is rendered non-conductive, and transistor M8 is rendered conductive, but the transistor M3 remains conductive, and the transistor M4 remains non-conductive due to the logic '0' stored at the storage node Q2. Thus neither the storage node QB1, nor the storage nodes QB2, changes its logic state, and so the transistors M2 and M6 remain conductive, enabling the struck node Q1 to replenish its original state.

As yet a further example, the case will be considered in which the circuit is in the state with the Q1 node at logic '0' shown in FIG. 7B, and the storage node Q2 is struck. The node Q2 is for example only affected if an impact occurs when the drain of transistor M14 (or M11 in the respective case) is reversed biased. Indeed, an impact when the drain of transistor M14 (or M11 in the respective case) is not reversed biased would result in the excess charge recombining to the substrate. Since transistor M14 (or M11 in the respective case) is a PMOS transistor, the bulk of which is usually biased to VDD, only a logic '0' at the node Q2 will result in a reversed bias junction. If an impact occurs while the node Q2 stores a logic '0', the resulting current transient for example changes the state at Q2 from a logic '0' to a logic '1'. This results in transistor M3 becoming non-conductive, and transistor M4 becoming conductive. However, transistor M7 remains conductive, and transistor M8 remains non-conductive due to the logic '0' stored at the node Q1. Thus neither the node QB1 nor the node QB2 changes its logic state. While Q2 does not have a direct path to the supply rails, it will eventually restore its original state due to leakage current through the transistors M13 and M14 forming the cut-off network 106. This process for example takes longer than the restoration of the main storage node Q1 after being struck, but it prevents an immediate flipping effect of the memory cell's logic state. Only the combination of a strike at the node Q1 while the node Q2 has not sufficiently regained its logic state will result in data corruption, and the odds of the same memory cell being struck twice within this small restoration time window are statistically relatively small.

Figure 8:
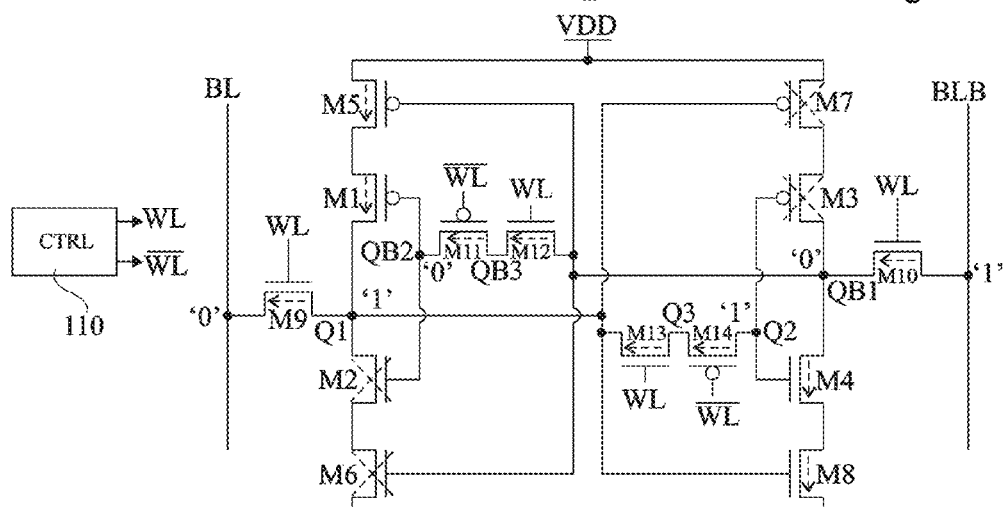
FIG. 8 schematically illustrates the memory cell of FIG. 6 during a WRITE operation of a logic '0' to the memory cell, overwriting a logic '1' stored by the memory cell.

FIG. 8 illustrates the memory cell 100 during an example of a write operation. During the write operation, the bit lines BL and BLB are for example pre-charged to the desired data to be written. The signals WL and $\overline{WL}$ are then asserted, WL to a logic '1', and $\overline{WL}$ to a logic '0'. This renders conductive both of the access networks formed by transistors M9 and M10 and both of the cut-off networks formed by the transistors M11, M12, M13 and M14. After a short transient time, the storage node Q1 or QB1 at a logic '1' will be set to a logic '0' through opposition between the pull up network (PUN) formed by transistors M1 and M5 or M3 and M7, and the access transistor M9 or M10. For the write operation to be successful, the PUN is for example weaker than the access transistor, satisfying the 'write constraint'. In the embodiments described herein, the PUN consists of two serially connected transistors that double its resistance path in comparison to the single 'access network' transistor, allowing for a successful 'write' operation. Since the transistors M11 to M14 of the cut-off networks are conducting, the same desired logic state will permeate to the secondary data storage nodes Q2 and QB2 as well. After the data is written, the control signals WL and $\overline{WL}$ are no longer asserted, thus returning the circuit to the hold state.

In the example of FIG. 8, the memory cell stores a logic '1', and a logic '0' is written by pre-charging the bit line BL to logic '0', and pre-charging the bit line BLB to logic '1'. Thus, assuming that QB1 was '0', the transistors M1 and M5 are conductive. Hence, after a short transient time, the voltage set to Q1 is a result of the opposition between the pull up network (PUN) transistors M1 and M5 and the access transistor M9, pulling down the '1' stored at Q1. Thus Q1 will be pulled down lower than the voltage threshold (VM as known in the art), rendering transistor M7 conductive and transistor M8 non-conductive. At the same time, the transistors M13 and M14 are conducting and will thus drive the logic '0' into the node Q2, rendering transistor M3 conductive and transistor M4 non-conductive. This results in the QB1 node changing its logic state from '0' to '1'.

For symmetrical reasons, a logic '1' is written to the cell in the same operation, except the bit line BL is pre-charged to a logic '1', and the bit line BLB is pre-charged to a logic '0'. The control signal WL is then brought to a logic '1' and the control signal $\overline{WL}$ is brought to a logic '0', rendering the transistors of both of the cut-off networks and both of the access networks conductive. Assuming that Q1 was '0', the transistors M3 and M7 are conductive. Hence, after a short transient time, the voltage set to QB1 is a result of the opposition between the pull up network (PUN) transistors M3 and M7 and the access transistor M10, pulling down the '1' stored at QB1. Thus QB1 will be pulled down lower than the voltage threshold (VM as known in the art), rendering transistor M5 conductive and transistor M6 non-conductive. At the same time, the transistors M11 and M12 are conducting and will thus drive the logic '0' into the node QB2, rendering transistor M1 conductive and transistor M2 non-conductive. This results in the Q1 node changing its logic state from '0' to '1'. After the data storage nodes have changed their logic state, the control signals WL and $\overline{WL}$ are no longer asserted, and the cell reverts to a hold state.

Figure 9:
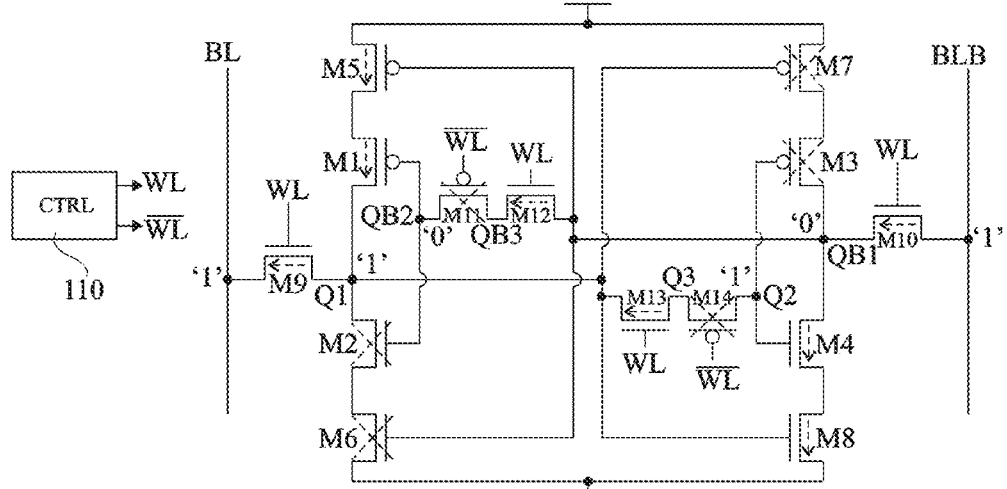
FIG. 9 schematically illustrates the memory cell of FIG. 6 during a READ operation of a logic '1' stored by the memory cell.

FIG. 9 illustrates the memory cell 100 during an example of a read operation. During a read operation, as shown in FIG. 9, the bit lines BL and BLB are pre-charged to VDD prior to the control signal WL being asserted. In some embodiments, a sense amplifier is connected to the bit lines BL and BLB and senses the voltage drop at the bit line coupled to the '0' holding node to determine the data that the memory cell holds.

There is a risk that a read operation results in the data being stored by the cell changing, for example if the pull down network formed by the transistors M2 and M6 in the case of Q1 holding a '0' or transistors M4 and M8 in the case of Q1 holding a '1', is weaker than the access transistor M9 or M10. In some embodiments, during a read operation, the cut-off networks are not activated. For example, the signal WL is bought to VDD in order to activate the transistors M9, M10, M12 and M13, but rather than being controlled by the signal $\overline{WL}$, the transistors M11 and M14 are controlled by a further signal (not illustrated in FIG. 9), which is for example generated by the control circuit 110 and remains at VDD during read operations, such that the transistors M11 and M14 remain non-conductive. Thus in a case where the main storage node Q1 or QB1 holds a logic '0' which is flipped to a logic '1' as a result of a read operation, the secondary storage node Q2 or QB2 will not be affected, and thus the inverted set will not be effected and will restore the information in the flipped node through the gated inverter. This state resembles aftermath of a particle impact at the main storage node, and therefore the memory cell will recover its original state using the same built-in SEU recovery mechanisms described above. Thus embodiment of the present disclosure may provide robustness and stabilization of read operations, in addition to or instead of providing an SEU hardening mechanism.

In some embodiments, rather than being controlled by the signal WL and $\overline{WL}$, the transistors M12 and M13 are controlled by a signal $S_{co}$ (not illustrated in FIG. 9), and the transistors M11 and M14 are controlled by a signal $\overline{S_{co}}$ (also not illustrated in FIG. 9), wherein during the hold state and read operations, the signal $S_{co}$ is low and the signal $\overline{S_{co}}$ is high, and during write operations, the signal $S_{co}$ is high and the signal $\overline{S_{co}}$ is low.

Figure 10:
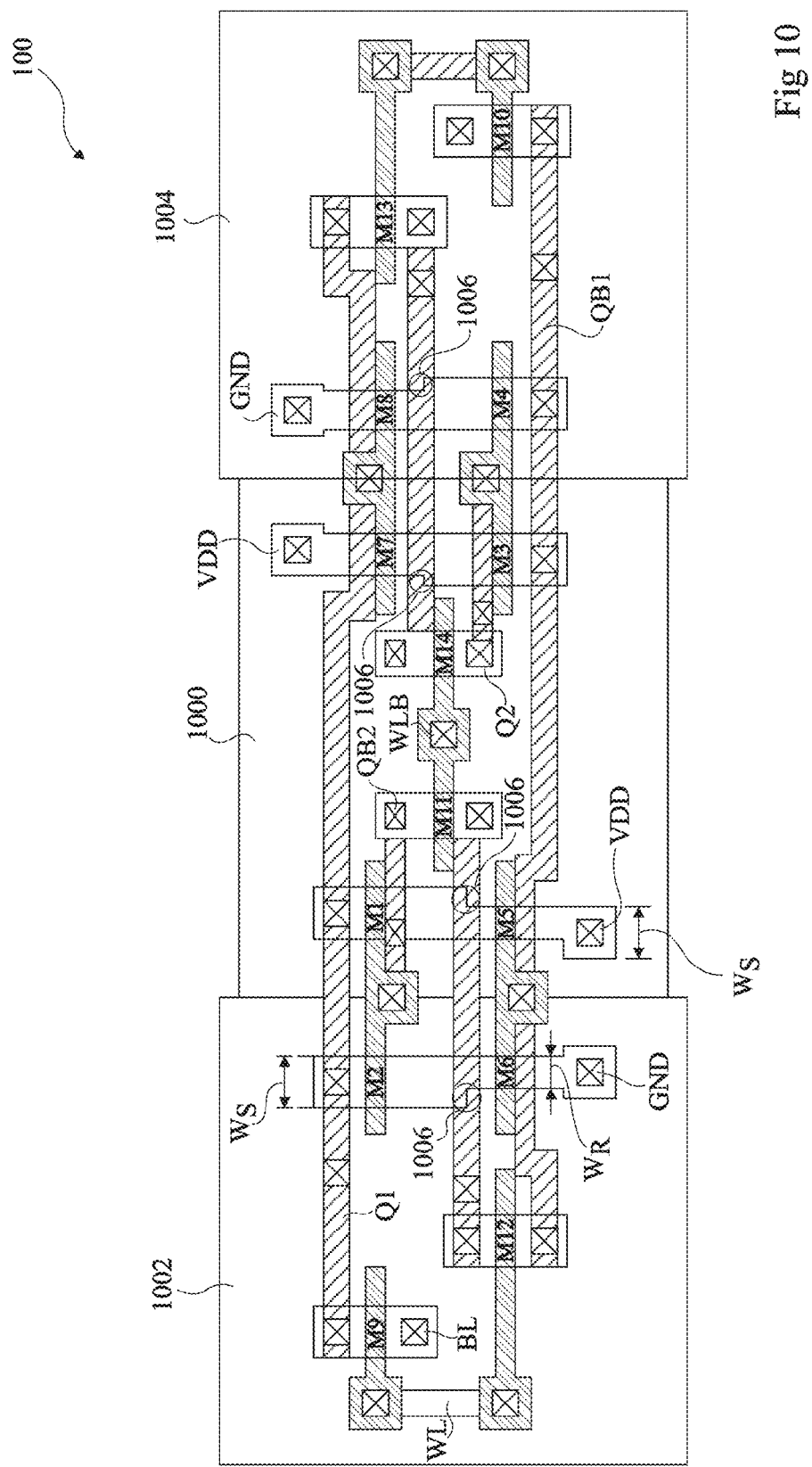
FIG. 10 illustrates an example of the physical layout of a memory cell, designed to reduce overall cell area, according to an example embodiment of the present disclosure.

FIG. 10 is a plan view illustrating an example of the physical layout of the memory cell 100. In FIG. 10, metal layers are illustrated with diagonal striping from bottom left to top right, and the positions of the transistors are indicated with the references M1 to M14 positioned in the metal forming each transistor gate. The active regions of the transistors are represented by non-striped regions running horizontally in FIG. 10. The polysilicon connections are represented with diagonal striping from top left to bottom right, with contacts indicated by crossed squares.

As illustrated, the PMOS transistors of the circuit are for example grouped in an n-type well (N-WELL) 1000 towards the centre of the memory cell, and the NMOS transistors are formed in zones 1002 and 1004 on either side of the N-WELL 1000, which may correspond to PWELLs, or to zones of a p-type substrate.

In order to avoid certain jog related design rules that bind the minimal transistor size to being relatively large, all transistors except for the transistors M5, M6, M7 and M8 are for example sized based on the minimal source/drain size permitted according to the production factory design-rules, which for example define a minimum width where a contact is to be encapsulated within an active region. Such a minimum width is higher than the minimum permitted transistor width, but allows the smallest spacing rules. Only the transistors M5, M6, M7 and M8, which act as an interface with the supply rails, are sized to the minimal width permitted by the production factory design-rules in order to reduce power consumption by increasing resistance. Thus, most of the transistors have the standard width $W_S$, allowing the smallest spacing and overall pitch, while only the transistors M5 to M8 have a reduced width $W_R$. The width $W_R$ is for example between 99 percent and 50 percent of the standard width $W_S$. Corners 1006 are for example present in the active regions where the drains of the transistors M5, M6, M7 and M8 meet the drains of the transistors M1, M2, M3 and M4 respectively.

Figure 11:
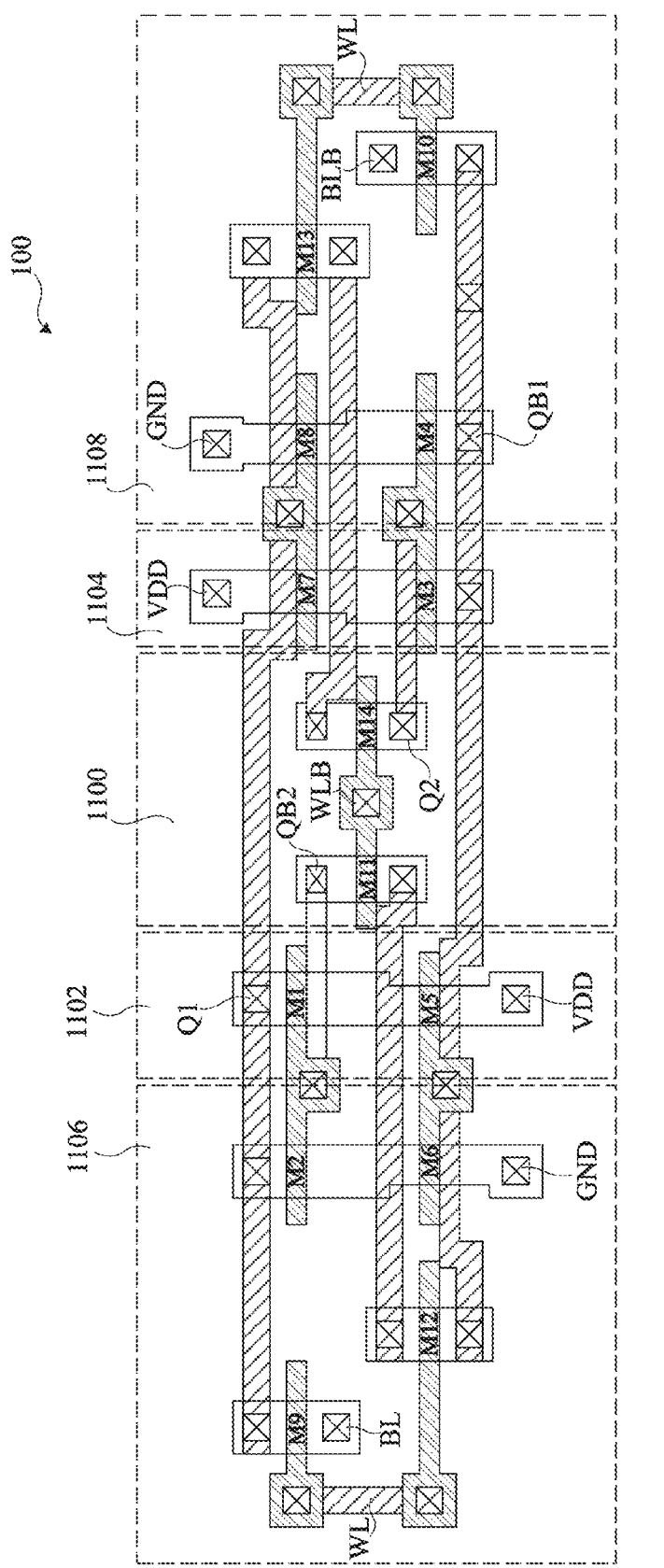
FIG. 11 illustrates an example of the physical layout of a memory cell providing protection from Multiple Node Upsets (MNU) according to an example embodiment of the present disclosure.

FIG. 11 is a plan view illustrating an example of the physical layout of the memory cell 100 according to an alternative example to that of FIG. 10. As illustrated in FIG. 11, the transistors M5, M6, M7 and M8 for example have active regions of reduced width with respect to the other transistors, and this feature will not be described again in detail. As represented in FIG. 11, the transistors M11 and M14 are for example formed in a central N-WELL 1100, whereas the transistors M1 and M5 are formed in a separate N-WELL 1102, and the transistors M3 and M7 are formed in yet a further separate N-WELL 1104. The NMOS transistors are formed either in PWELLs, or within a p-type substrate. For example, the transistors M2, M6, M9 and M12 are formed in a zone 1106 to the left of the N-WELL 102, and the transistors M4, M8, M10 and M13 are formed in a zone 108 to the right of the N-WELL 108.

Charge deposited on the substrate by an energized particle diffuses and spreads out, which might result in a Multiple Node Upset (MNU) due to charge sharing between nodes. Since the method for reducing SEU susceptibility described herein relies on redundancy, such a strike at a specific sensitive node pair, such as at the nodes Q1 and Q2, or QB1 and QB2, or Q1 and QB1, could result in data corruption. The distance needed for preventing possible charge sharing between two PMOS transistors or two NMOS transistors is significantly larger than the distance needed for preventing possible charge sharing between an NMOS and PMOS. This is due to the potential barrier from the P-substrate to the N-WELL.

The layout illustrated in FIG. 11 advantageously permits sensitive nodes to be isolated from each other. In particular, sensitive PMOS-PMOS node pairs are placed in separated N-WELLs and NMOS-NMOS node pairs are distant from each other. For example, the PMOS transistors M4 and M8 are placed in a separate N-WELL from the PMOS transistor M14, and the PMOS transistors M2 and M6 are placed in a separate N-WELL from the PMOS transistor M11.

Figure 12:
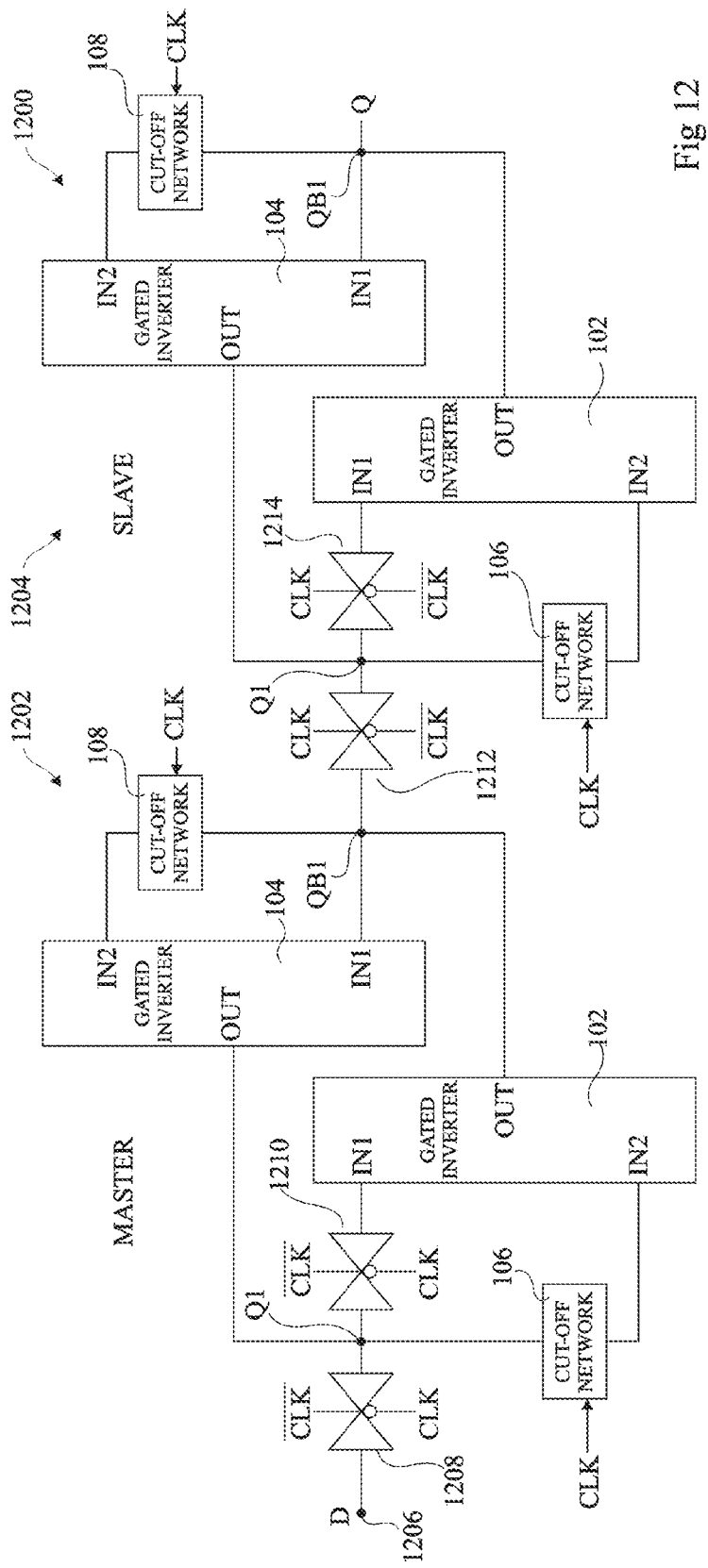
FIG. 12 schematically illustrates a synchronous memory device comprising a pair of memory cells according to an embodiment of the present disclosure.

FIG. 12 schematically illustrates a synchronous memory device 1200, which is for example a D-type flip-flop, comprising a master latch 1202 and a slave latch 1204, each of which is for example implemented by a memory cell similar to the memory cell 100.

For example, the master latch 1202 comprises the gated inverters 102, 104 coupled between storage nodes Q1, QB1, and cut-off networks 106, 108 coupled between the inputs IN1 and IN2 of the gate inverters 102, 104 respectively. A data input node 1206 of the latch, which for example receives a data signal D to be stored by the latch, is for example coupled to the storage node Q1 of the master latch 1202 via a transmission gate 1208 controlled by clock signals CLK and $\overline{CLK}$ so that it conducts when the clock signal CLK is low. In the master latch 1202, the storage node Q1 is for example coupled to the input IN1 of the gated inverter 102 via a transmission gate 1210 controlled in the same manner as the transmission gate 1208.

The slave latch 1204 for example comprises gated inverters 102 and 104 cross-coupled between storage nodes Q1 and QB1, and cut-off networks 106, 108 coupled between the inputs IN1 and IN2 of the gate inverters 102, 104 respectively. The node Q1 of the slave latch 1204 is for example coupled to the node QB1 of the master latch 1202 via a transmission gate 1212 controlled by clock signal CLK and $\overline{CLK}$ to conduct when the clock signal CLK is high. In the slave latch 1204, the storage node Q1 is for example coupled to the input IN1 of the gated inverter 102 via a transmission gate 1214 controlled in the same manner as the transmission gate 1212.

An output node Q of the flip-flop 1200 is for example coupled to the storage node QB1 of the slave latch 1204.

The transmission gates 1208, 1210, 1212 and 1214 are for example each implemented by an NMOS transistor and a PMOS transistor coupled in parallel with each other, as known by those skilled in the art.

The gated inverters 102, 104 of the master and slave latches 1202, 1204 are for example implemented by the circuit of FIG. 2 or its variants discussed herein. The cut-off networks 106, 108 of the master and slave latches 1202, 1204 are for example implemented by the circuit of FIG. 5, or its variants discussed herein. The cut-off networks 106, 108 of the master latch 1202 are for example controlled by the clock signal CLK so that they are conductive while the clock signal CLK is low, and non-conductive while the clock signal CLK is high. The cut-off networks 106, 108 of the slave latch 1204 are for example controlled by the clock signal CLK so that they are conductive while the clock signal CLK is high, and non-conductive while the clock signal CLK is low.

In operation, data is clocked into the master latch 1202 while the clock signal CLK is low, corresponding to a write operation of the master latch. While the clock signal is low, the slave latch 1204 is in a hold state. The data is transferred to the slave latch 1204 and becomes available at the output node Q of the flip-flop when the clock signal CLK goes high, corresponding to a write operation of the slave latch. While the clock signal is high, the master latch 1202 is in a hold state. The memory cells implemented in each of the master and slave latches 1202, 1204 of the flip-flop are radiation hardened in the same manner as the memory cell of FIG. 1.

While a number of detailed embodiments have been described herein, it will be understood that many substitutions, changes and variations in the described embodiments, applications and details of the method and system illustrated herein and of their operation or layout can be made by those skilled in the art without departing, deriving from the teachings of this invention.

Furthermore, from the description above it is clear that certain preferred embodiments have been described, but those known to the art will find additional implementations from the teachings of this disclosure. For example, it is also clear that wherever a single entity is indicated in a described embodiment, the purpose is to make the explanation more readable. The teachings of this disclosure remain valid in case a plurality of items is utilized. For example, the use of a plurality of cells, as disclosed above, that might or might not be interconnected as to create, in a preferred embodiment, a memory array protected from radiation with low power consumption. The physical layout and performance values and details of the elements in the described embodiments and other implementations deriving from the teachings of this disclosure can be easily calculated and designed by those skilled to the art.

In the examples and described embodiments it is assumed that the substrate on which the transistors are realized is of p-type as is usually available in the art. It is clear to those skilled in the art that the same teaching can be applied if the substrate is not of p-type, but of n-type. In this case, the definitions of PMOS and NMOS will be exchanged as it is well known by those skilled in the art.

What is claimed is:

1. A memory cell comprising:
   first and second gated inverters, each gated inverter comprising first and second inputs and an output and being adapted to couple its output to a first logic level only when the first and second inputs both receive the inverse of the first logic level, wherein the first input of the first gated inverter is coupled to the output of the second gated inverter and the first input of the second gated inverter is coupled to the output of the first gated inverter;
   a first cut-off circuit coupling the second input of the first gated inverter to the first input of the first gated inverter; and
   a second cut-off circuit coupling the second input of the second gated inverter to the first input of the second gated inverter.

2. The memory cell of claim 1, wherein the first and second cut-off circuits each comprise at least one transistor of a first conductivity type and at least one further transistor of an opposite conductivity type to the first conductivity type.

3. The memory cell of claim 1, wherein:
   the first cut-off circuit comprises first and second transistors coupled in series between the first and second inputs of the first gated inverter; and
   the second cut-off circuit comprises first and second transistors coupled in series between the first and second inputs of the second gated inverter.

4. The memory cell of claim 3, wherein the first transistors of the first and second cut-off circuits are p-channel MOS transistors, and second transistors of the first and second cut-off circuits are n-channel MOS transistors.

5. The memory cell of claim 1, wherein each of the first and second gated inverters comprises:
   first and second transistors coupled in series between the output and a first voltage supply rail; and
   third and fourth transistors coupled in series between the output and a second voltage supply rail, wherein control nodes of the first and fourth transistors form the first input of the gated inverter and control nodes of the second and third transistors form the second input of the gated inverter.

6. The memory cell of claim 5, wherein:
   the first transistor of each gated inverter is connected to the first voltage supply rail and is of narrower width than the second transistor of each gated inverter; and/or
   the fourth transistor of each gated inverter is connected to the second voltage supply rail and is of narrower width than the third transistor of each gated inverter.

7. The memory cell of claim 5, wherein:
   the first cut-off circuit comprises first and second transistors coupled in series between the first and second inputs of the first gated inverter;
   the second cut-off circuit comprises first and second transistors coupled in series between the first and second inputs of the second gated inverter;
   the first and second transistors of the first and second gated inverters are p-channel MOS transistors;
   the first and second transistors of the first and second cut-off circuits are p-channel MOS transistors formed in a first n-type well separate from one or more n-type wells in which the first and second transistors of the first and second gated inverter are formed.

8. The memory cell of claim 7, wherein the first and second transistors of the first gated inverter are formed in a second n-type well, and the first and second transistors of the second gated inverter are formed in a third n-type well.

9. A memory device comprising:
   at least one memory cell including:
      first and second gated inverters, each gated inverter comprising first and second inputs and an output and being adapted to couple its output to a first logic level only when the first and second inputs both receive the inverse of the first logic level, wherein the first input of the first gated inverter is coupled to the output of the second gated inverter and the first input of the second gated inverter is coupled to the output of the first gated inverter;

a first cut-off circuit coupling the second input of the first gated inverter to the first input of the first gated inverter; and a second cut-off circuit coupling the second input of the second gated inverter to the first input of the second gated inverter; and a control circuit adapted to control the first and second cut-off circuits of the at least one memory cell to be non-conducting during a hold state of the memory cell, and to control the first and second cut-off circuits of the at least one memory cell to be conducting during a write operation of the memory cell.

10. The memory device of claim 9, wherein the control circuit is further adapted to control the first and second cut-off circuits of the at least one memory cell to be non-conducting during a read operation of the memory cell.

11. The memory device of claim 9, wherein the memory device is a memory array and wherein the at least one memory cell includes a plurality of memory cells arranged in columns and rows, wherein the memory cells of each column are coupled between a common pair of bits lines of the column.

12. The memory device of claim 11, wherein each memory cell is coupled to a first bit line of the common pair via a first access network and coupled to a second bit line of the common pair via a second access network, and wherein the control circuit is further adapted to control the first and second access networks to be conductive during a write operation of each memory cell, and to be non-conductive during a hold state of each memory cell.

13. The memory device of claim 9, wherein the memory device is a synchronous memory device comprising:

a master latch including a first memory cell of the at least one memory cell; and a slave latch coupled to an output of the master latch and including a second memory cell of the at least one memory cell.

14. A method of controlling a memory cell comprising first and second gated inverters, each gated inverter comprising first and second inputs and an output and being adapted to couple its output to a first logic level only when the first and second inputs both receive the inverse of the first logic level, wherein the first input of the first gated inverter is coupled to the output of the second gated inverter and the first input of the second gated inverter is coupled to the output of the first gated inverter, the method comprising:

selectively coupling, by a first cut-off circuit, the second input of the first gated inverter to the first input of the first gated inverter; and selectively coupling, by a second cut-off circuit, the second input of the second gated inverter to the first input of the second gated inverter.

* * * * *